United States Patent
Hollander et al.

(10) Patent No.: US 8,302,050 B1
(45) Date of Patent: Oct. 30, 2012

(54) AUTOMATIC DEBUG APPARATUS AND METHOD FOR AUTOMATIC DEBUG OF AN INTEGRATED CIRCUIT DESIGN

(75) Inventors: Yoav Hollander, Kiryat-Ono (IL); Yael Feldman, Neve-Monosson (IL)

(73) Assignee: Cadence Design Systems, Inc., San Jose, CA (US)

( * ) Notice: Subject to any disclaimer, the term of this patent is extended or adjusted under 35 U.S.C. 154(b) by 137 days.

(21) Appl. No.: 12/765,830

(22) Filed: Apr. 22, 2010

(51) Int. Cl.
*G06F 9/455* (2006.01)
*G06F 17/50* (2006.01)

(52) U.S. Cl. ............ 716/111; 716/51; 716/106; 716/136

(58) Field of Classification Search ............... 716/51, 716/111, 106
See application file for complete search history.

(56) References Cited

U.S. PATENT DOCUMENTS

| | | | |
|---|---|---|---|
| 6,185,726 B1 * | 2/2001 | Chou | 716/104 |
| 7,353,467 B2 * | 4/2008 | Robertson et al. | 716/138 |
| 2008/0276206 A1 * | 11/2008 | Mariani | 716/4 |

* cited by examiner

*Primary Examiner* — Vuthe Siek
*Assistant Examiner* — Brian Ngo
(74) *Attorney, Agent, or Firm* — Kilpatrick Townsend & Stockton LLP

(57) ABSTRACT

A computerized method of characterizing a DUV includes executing in a verification environment (VE) a set of verification tests to stimulate the DUV to collect test results from the DUV. The method further includes collecting a set of failure data for the test results; and generating sets of common failures based on clusters of features of interest in the set of failure data. The method further includes generating a set of hints from the common failures; wherein the hints indicate a potential failure mode or a potential root cause failure of the DUV for the test results for the simplified set of tests; and generating a set of debug data from the clusters of features of interest. The method further includes transferring the set of hints and the set of debug data to a user computer for storage, display, and use in an interactive debug session of the DUV.

36 Claims, 2 Drawing Sheets

AUTOMATIC DEBUG APPARATUS AND METHOD FOR AUTOMATIC DEBUG OF AN INTEGRATED CIRCUIT DESIGN

BACKGROUND OF THE INVENTION

The present invention generally relates to an apparatus and a method for circuit design. More particularly, the present invention generally relates to an apparatus and method for automating the debug of design models and verification environments for integrated circuits.

Modern circuit design of integrated circuits (ICs) is a combination of automated design and debug of the design. ICs are often automatically designed using specialized computer program code that serves as simulation of the IC. The design of complex ICs generally requires a high level of design verification before millions of dollars are committed to the manufacture of the ICs. Design verification typically includes running a verification program on a design (often referred to as a DUV, or design under verification). Much of the verification is carried out by stimulation of the DUV at a logical level, where the DUV is modeled with one or more hardware description languages (HDLs).

A "verification environment" (VE) is created to stimulate the DUV, check the responses from the stimulated DUV, and collect coverage information used to measure the degree to which the DUV was exercised during verification. VEs are typically written in one or more verification languages, such as e, System Verilog, or SystemC.

The complexity of modern designs for complex ICs typically requires large amounts of stimulation to achieve significant test coverage of design verification (e.g., to exercise the DUV sufficiently to demonstrate that the DUV works as desired). It is not uncommon for thousands of stimulations to run for weeks on a computer farm in order to verify a specific version of a DUV. As the design process progresses, the DUV is updated and the verification task is typically repeated.

A computer farm typically contains hundreds, or even thousands of computers working together to verity a DUV. The computer farm is typically used to run verification tasks non-stop throughout the design process, which often goes on for many months.

Failures in a DUV are often encountered during stimulation of the DUV by the VE. The failures typically indicate potential problems with the DUV or the VE. The output of failure information forms an important part of the verification process as the failure information may reveal design errors of the DUV and/or the VE that need to be debugged and fixed before an IC is fabricated. Each piece of failure information output from a verification process is typically examined and diagnosed in an attempt to ensure that no errors are overlooked prior to fabrication.

The process of diagnosing failures in a DUV during the verification process is typically referred to as debug. Verification engineers typically examine raw data from a set of verification tests (often referred to as "runs") in an attempt to locate and fix bugs in a DUV. Debugging a DUV is typically a challenging intellectual process that traditionally has been conducted by expert engineers. Continuously running stimulations generates a relatively large amount of failure data to be reviewed for DUV debug by a team of design verification experts, technicians, and the like devoted to debugging. Due to the relatively large amount of data generated by running a stimulation of a DUV these engineers and technicians spend relatively larges amount of time and mental effort to analyze data to locate bugs. The debug process is a bottleneck in the design process, which affects engineering costs and schedules for moving IC to market.

Therefore, a need exists to improve the debug process so that designers and verification engineers can reduce the time they spend debugging DUVs by developing debug methods and apparatus that automate portions of the debug process typically performed by the designers and the verification engineers.

BRIEF SUMMARY OF THE INVENTION

The present invention generally provides an apparatus and a method for circuit design. More particularly, the present invention provides an apparatus and method for automating the debug of design models and verification environments for integrated circuits.

According to one embodiment of the present invention, a computerized method of characterizing a DUV includes executing in a verification environment (VE) a set of verification tests to stimulate the DUV to collect test results from the DUV. The method further includes collecting a set of failure data for the test results; and generating sets of common failures based on clusters of features of interest in the set of failure data. The method further includes generating a set of hints from the common failures; wherein the hints indicate a potential failure mode or a potential root cause failure of the DUV for the test results for the simplified set of tests; and generating a set of debug data from the clusters of features of interest. The method further includes transferring the set of hints and the set of debug data to a user computer for storage, display, and use in an interactive debug session of the DUV.

According to one specific embodiment, the features of interest include i) log messages, ii) trace information from a trace of executing the set of verification tests or executing the set of simplified tests, or iii) coverage information derived from set of failure data or the sets of common failures. The step of generating the set of hints includes collecting hints by static hint collection. Static hint collection includes lint checking source code of a DUV to identify a known pattern in the source code, which indicates a potential failure mode or a potential root cause of the DUV. Static hint collection includes correlating the known pattern in the source code with test failure information from execution of the set of verification tests or the set of simplified tests.

According to another specific embodiment, the step of generating the set of hints includes collecting hints via dynamic hint collection. Dynamic hint collection includes analyzing run traces from the traces of test runs for the set of verification tests or for the set of simplified tests.

According to another specific embodiment, the computerized method further includes i) generating a set of simplified tests from the set of verification tests based on the sets of common failures, wherein the simplified tests includes failing tests from the set of verification tests; ii) executing in the VE the set of simplified tests on the DUV to collect a test results from the DUV; iii) generating another set of hints from the test results from the execution of the set of simplified tests; wherein the hints in the other set of hints indicate a potential failure mode or a potential root cause failure of the DUV for the test results for the simplified set of tests; and iv) transferring the other set of hints to a user computer for storage, display, and use in an interactive debug session of the DUV.

According to another specific embodiment, the step of generating the set of simplified tests from the set of verification tests is iteratively performed until tests, which have passing tests, are removed from the set of verification tests. The step of generating the set of simplified tests includes analyzing the test results for the set of verification tests to identify failing tests in a temporal window of the tests results for the set of verification tests, and removing the set of verification tests the tests that are outside of the temporal window.

According to another specific embodiment, the method further includes executing primary fix regression. The step of executing primary fix regression includes generating a compact regression test set based on the sets of common failures, wherein the compact regression test set is configured to include passing test results for verification that a bug in the DUV fixed subsequent to debugging the DUV.

Another embodiment of the present invention includes a computerized method for characterizing a design under valuation (DUV) by a set of computers on a computer farm. The method includes executing in a verification environment (VE) a set of verification tests on a DUV to stimulate the DUV to collect test results from the DUV. A set of failure data is collected for the test results. Sets of common failures are generated based on clusters of features of interest in the set of failure data, and a set of simplified tests is generated from the set of verification tests based on the sets of common failures. The simplified tests include failing tests from the set of verification tests. The method further includes executing in the VE the set of simplified tests on the DUV to collect a test results from the DUV. A set of hints is generated from the test results from the execution of the set of simplified tests. The hints indicate a potential failure mode or a potential root cause failure of the DUV for the test results for the simplified set of tests. The method further includes generating a set of debug data from trace information collected during the execution of the set of verification tests, and transferring the set of hints and the set of debug data to a user computer for storage, display, and use in an interactive debug session. According to a specific embodiment, the features of interest include: i) log messages, ii) trace information from a trace of executing the set of verification tests or executing the set of simplified tests, iii) coverage information derived from set of failure data or the sets of common failures, etc.

According to another specific embodiment, the step of generating the set of hints includes collecting hints by static hint collection. Static hint collection includes lint checking source code of an DUV to identify known patterns in the source code, which indicate a potential failure mode or a potential root cause of the DUV. Static hint collection may also include correlating the known patterns in the source code with test failure information from execution of the set of verification tests or the set of simplified tests.

According to another specific embodiment, the step of generating the set of hints includes collecting hints via dynamic hint collection. Dynamic hint collection includes analyzing run traces from the traces of test runs for the set of verification tests or for the set of simplified tests.

According to another specific embodiment, the step of generating the set of simplified tests from the set of verification tests is iteratively performed until tests, whose runs all pass, are removed from the set of verification tests. The step of generating the set of simplified tests may also include analyzing the test results for the set of verification tests to identify failing tests in a temporal window of the tests results for the set of verification tests, and removing from the set of verification tests the tests that are outside of the temporal window.

According to another specific embodiment, the method further includes executing primary fix regression on the set of verification tests. Primary fix regression includes generating a compact regression test set based on the sets of common failures. The compact regression test set is configured to include passing test results for verification that a (previously uncovered) bug in the DUV is fixed subsequent to debugging the DUV.

These and other embodiments of the present invention are described in more detail in conjunction with the text below and the attached figures.

DETAILED DESCRIPTION OF THE INVENTION

Figure 1:
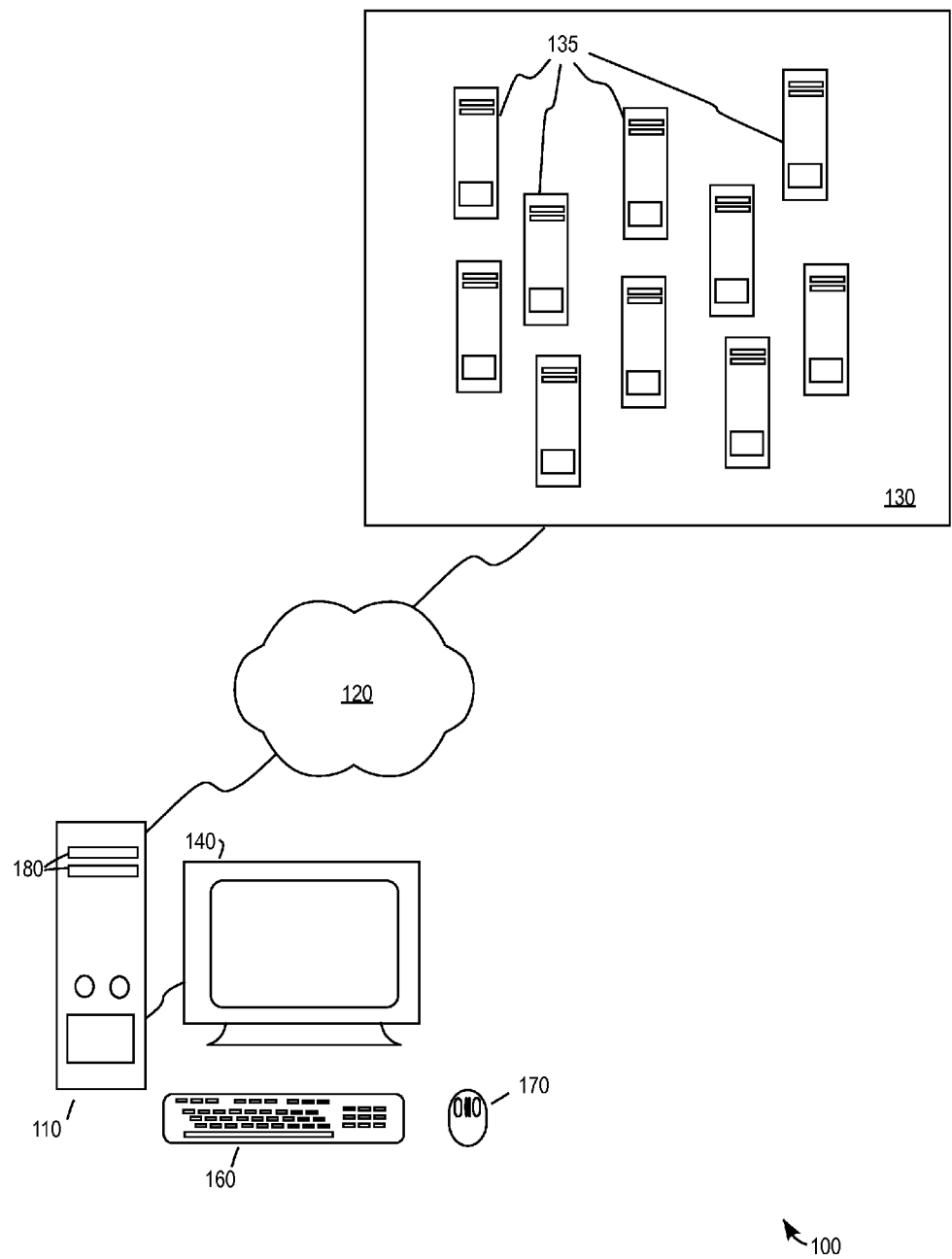
FIG. 1 is a simplified schematic of a computing system according to one embodiment of the present invention.

FIG. 1 is a simplified schematic of a computing system 100 according to one embodiment of the present invention. The computing system includes a user computer 110 coupled through a network 120 to a computer farm 130. The user computer may be a personal computer (such as a desktop computer), a work station, a laptop computer, or the like. The user computer may be a computer at which a circuit designer, a computer programmer, a debug engineer, or the like may work to generate a design for an integrated circuit, write a computer program to verify the design, and debug the design based on failure data generated by a verification program (sometimes referred to herein as a verification environment). The user computer may include a computer monitor 140 on which audiovisual data may be presented to a user (e.g., a human user). The user computer may also include one or more control devices, such as a keyboard 160, a mouse 170, a puck, a joystick, etc. The user computer may also include one or more processors, and one or more memory devices 180. The one or more memory devices may be machine-readable memory devices on which computer code and any results generated by the running computer code may be stored. The one or more memory devices may include a RAM, a ROM, a CD and drive for the CD, a hard disk drive, an optical drive, etc.

Network 120 may include a local area network and/or a wide area network, such as the Internet. Network 120 may also include one or more server computers, which are configured to facilitate communications on the local area network and the wide area network. The one or more server computers may include various memory devices for storing computer code, and for storing any results generated by the computer code running on the one or more server computers, the user computer, and/or the computer farm.

Computer farm 130 may include a plurality of computers 135, which may include personal computers, super computers, server computers, etc. The computer farm may include one or more memory devices, such as the memory devices 180 described above. The memory device may be a collective memory device for collective use by the computers on the computer farm. Each computer on the computer farm may also include a processor and one or more memory devices, such as memory devices 180. Each of the memory devices described herein may be configured to store computer code configured to embody embodiments of the present invention.

Embodiments of the present invention include a computerized method that is configured to be executed by computer system 100. Additional embodiments of the present invention include a computer program product that includes computer code, which is configured to be stored in one or more memories of computer system 100 and run on one or more computers of computer system 100. Computer system 100 executing the computerized methods of the present invention is a machine configured to automate the debug of designs under verification (DUVs) and debug the verification environments (VEs). VEs include tests that operate on the computer farm to stimulate a DUV and collect output from the DUV. The VE is used to generate failure information for a DUV, such as log messages, coverage data, and trace information. Computer system 100 executing the computerized methods described herein is an apparatus (or machine) according to an embodiment of the present invention for DUV debug. Computer 135 on computer farm 130 executing the computerized methods described herein are apparatus (or machines) according to an embodiment of the present invention for DUV debug.

Figure 2:
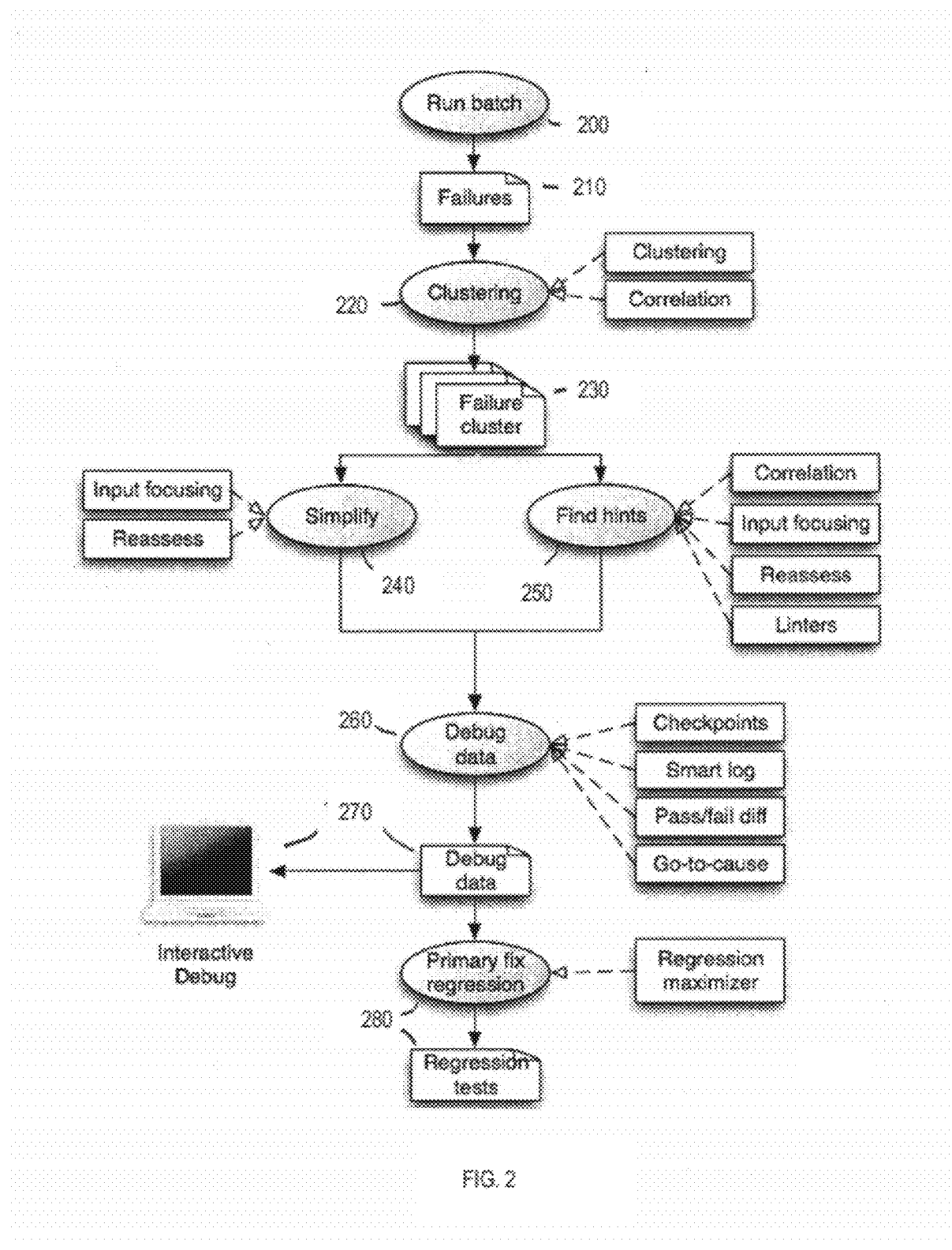
FIG. 2 is a high-level flow diagram of a computerized method for debugging a DUV according to one embodiment of the present invention.

FIG. 2 is a high-level flow diagram of a computerized method for debugging a DUV according to one embodiment of the present invention. The high-level flow diagram is exemplary and those of skill in the art will recognize that various steps in the flow diagram may be added, combined, or the like without deviating from the spirit and purview of the embodiment of the present invention. The high-level flow diagram is not limiting on the claims. At an initial step 200 a set of "verification" tests are executed by a VE on a DUV. A "set" as referred to herein may include one or more elements. A "test run" as referred to herein includes running one or more stimulation tests by a VE on a DUV. Stimulation tests generally include the VE stimulating the DUV and collecting data output from the DUV where the output is a resultant of the stimulation. For example, a DUV may include a video circuit, an audio circuit, an I/O circuit, a processor circuit, and the like. The VE may be configured to stimulate the DUV in a variety of ways to test one or more of these circuits during a test run as will be well known by those of skill in the art. A DUV having a video circuit, an audio circuit, an I/O circuit, and a processor will be discussed herein for exemplary purposes to draw attention to specific portions of the apparatus and method embodiments of the present invention. It is understood that the apparatus and method discussed herein are not limited for use with the exemplary DUV.

The set of verification tests run during a test run may be selected by a user via user computer 110. The set of verification tests run during a test run to test a DUV may by executed on one or more computers 135 on computer farm 130. The executed set of verification tests may include a plurality of stimulations of the DUV on the computer farm. The execution of the set of verification tests may take many hours or days.

At a step 210, the output from the DUV under test stimulation is collected in a set of failure data by the computer farm. The set of failure data may include the data from failed tests that were run by the VE on the DUV to stimulate the DUV. The set of failure data may also include identifiers for the verification tests run on the DUV and/or other information, which will be well known to those of skill in the art. A set of failure data may include a variety of data types and information types, such as text, charts, graphs, number tables, output vectors, statistical results, and the like. For example, a set of failure data may include data that indicates that the video portion, audio portion, and I/O portion failed.

At a step 220, the set of failure data is analyzed by the computer farm to find commonality between the failures, such as commonality between failed tests, the data for the failed tests, etc. Commonality between failures may include a variety of common features. For example, the tests may be run randomly on a DUV with various latency differences between the tests. Each test on each individual circuit portion of a DUV might not fail when running alone. But, for example, each time a video portion of the DUV is stimulated within say 10-30 milliseconds of the audio portion of the DUV being initialized, the video and audio portions of the DUV may fail. A number of tests may be run on the DUV with various latencies between stimulation of the video circuit and initialization the audio circuit. The common failure may be associated with these series of tests run on the video circuit and the audio circuit with various latencies. The foregoing is merely one example of common failures that may be determined by the computer farm. Those of skill in the art will know of a plethora of other failure types.

According to one embodiment of the present invention, the computer farm may be configured to find commonality between failures by a variety of methods. For example, the computer farm may be configured to run various statistical analyses on the set of failure data to find commonality between the failures. The various statistical analyses may analyze a variety of statistical relationship on a variety of attributes of the failures in the set of failure data.

At a step 230, the computer may analyze "features of interest" in the set of failure data and organize the features of interest into sets of common failures. Organizing the features of interest into sets of common failures is sometimes referred to herein as clustering the failures. According to one embodiment, the set of failure data may be parsed into sections where the sections are the sets of common failures. Features of interest may include a variety of information that is included in the set of failure data or may be derived from the set of failure data via various processes, such as statistical processes applied to the set of failure data to determine trends or the like in the set of failure data.

According to one embodiment, features of interest may include the error location within the set of failure data. According to one embodiment, features of interest may be the error location at which a failure occurred within the program code for the DUV or the VE. The error location might alternatively be the temporal location (e.g., a temporal window) of failures within the set of failure data, a physical location of the failures within the set of failure data, or the like. Test runs with the same error location may be organized into a set of common failures (e.g., clustered together). Other features of interest include, for example, log messages, user input criteria, and the like. Organizing features of interest into sets of common failures may be iteratively performed until convergence on a failure, where during each iteration, additional techniques are used by the computer farm to extract additional features of interest from the set of failure data. Convergence generally refers to extracted features that point to a common root cause of failure.

The organization of the set of failure data into sets of common failures may be an iterative process of reviewing the set of failure data via different techniques, such as different statistical analysis techniques. According to an alternative embodiment, the organization of the set of failure data into sets of common failures may be performed by detecting common features in the set of failure data where the common features might not appear in passing runs of tests or might appear a relatively insignificant number of times in the passing runs. The common features might include key features that include data that is substantially determinative of a failure.

Each set of common failures may be for a suspected specific failure in the DUV or the VE. For example, a set of common failures may indicate that a video circuit on a DUV fails when used at the same time as the audio circuit on the DUV. According to one embodiment of the present invention, the sets of common failures may be reported to the user computer for use by a user of the user computer. Because various statistical analysis are run on the set of failure data to determine a likely failure mode for a set of common failures, the failures in each set of common failures tend to have a common failure mode and a common root cause. Therefore, reporting the sets of common failures to a designer, a verification engineer, or the like indicates to the designer and verification engineer likely portions of a circuit to analyze to find a root cause of a problem and fix the problem (i.e., debug the problem).

According to one embodiment of the present invention, the sets of common failures may be sent from the computer farm to the user computer for review by the user. Because common failures are grouped together, the user has a indication of possible specific portion of a DUV that may have failed and may therefore direct her attention during debug to the specific portion of the DUV. Therefore, the designer's or the verification engineer's time and effort in distilling information from a set of failure data are further reduced. The designer's and the verification engineer's metal efforts are also reduced by presenting the clustering information.

According to one embodiment of the present invention, a set of common failures (or a failure cluster) is assumed by the computer farm to have a common failure mode and a common root cause failure associated with the failure cluster. According to one embodiment, at a step 240, the computer farm uses the assumption that each set of common failures has a common failure mode and common root cause failure to simplify a set of tests to "focus" in on the failures that are occurring in the DUV. Simplification tests focus on the suspected failure modes and the suspected common root causes of failures and may include reduced numbers of tests for a test run where the removed tests may not be associated with the suspected failure mode and/or the suspected root causes. For example, if a video circuit, an audio circuit, and an I/O circuit on an DUV are tested in an initial test run using the set of verification tests, and the computer farm determines that the I/O circuit is not failing, the computer system may determine this via the above described analysis of the set of failure data and the clustering. The computer farm may then remove (e.g., simplify) the I/O tests from a test run to focus the tests on the video circuit and the audio circuit. Further, it might be determined that the video circuit only fails while the audio circuit is being initialized. The computer farm may determine this by clustering the common failures as described above. Therefore, the computer farm can further simplify tests performed during a test run by removing all tests that might test the video circuit at a different time from the audio circuit, and removes tests where the audio circuit is not being initialized.

According to one embodiment, the simplification of tests may be iteratively performed by iteratively removing test instructions from a test run. That is, a first set of test instructions may be removed from a test, and the simplified tests may be run and analyzed as described above by generating sets of failure data, clustering the failures, and thereafter, removing additional test instructions from a test. This step may be repeated to focus on a failure, for example, of a suspected failure mode and a suspected root cause of a failure.

According to a further embodiment, the simplification of tests for use during a test run may include temporally analyzing when failures occur in a test run for a set of tests, such as the set of verification tests, and eliminating tests from the set of verification tests where the tests eliminated are outside of a temporal window (e.g., a period of time) in which the failures occurred. For example, the computer farm may be configured to determine that failures occurred at the beginning third of a test run (e.g., a temporal window at beginning of a test run), and may remove tests from the latter two thirds of the test run.

Running the simplified tests in a test run provides a smaller set of failure data than the test run discusses at step 200 above. For the simplified test run in which the simplified tests are run, sets of failure data may be collected as described above, and sets of common failures may be created from analysis of the sets of failure data as described above.

The simplified tests and data collected from running the simplified tests on the computer farm to stimulate the DUV may be saved in memory on the computer farm, the user computer, or other memory. The saved simplified tests and data collected therefrom may be used by the computer farm for debug analysis and/or for transfer to, and presentation on, the user computer.

According to a further embodiment of the present invention, a set of hints for a bug may be generated by the computer farm at a step 240. The hints may be collected for analysis by the computer farm, or reported to the user computer for review by a user to debug a DUV. A hint includes any relevant information that indicates a failure mode or a root cause of a failure. Hint collection may be static or dynamic. Static hint collection techniques include the use of "lint" checkers, which are configured to statically analyze the source code of a DUV and/or a VE and identify suspicious code that may provide an explanation of one or more of the observed failures in a set of failures, a set of common failures or the like. For example, the lint checker may analyze the source code of a DUV and/or a VE for known patterns that indicate a potential failure mode or a potential root cause of a failure for the DUV. Examples of lint checkers are described in copending U.S. application patent Ser. Nos. 12/649,259 and 12/649,260, both titled, "Detecting Indexing Errors In Declarative Languages," assigned to the owner of the instant application, and incorporated by reference herein for all purposes. The lint checker may be configured to correlate the suspect source code portions with the observed failures, which were determined by the computer farm as described above. A hint generated by a lint checker may provide lines of source code, which a suspected failure may be associated with. The correlation of lines of source code with failures from test runs is sometimes referred to as a "source cliff," and provides a relatively high degree of specificity and accuracy to a hint.

Dynamic hint collection may include methods for analyzing test run traces (e.g., a substantially continuous portion of data output during a test run) for sets of common failures. According to one embodiment, the computer farm may be configured to re-execute tests associated with the sets of common failures and vary (e.g., slightly perturb) the inputs for these tests for the DUV to collect additional hints. The hints may be saved in memory for later analysis and use by the computer farm, and/or for transfer to, and presentation on, the user computer.

According to one embodiment, hints may be generated by various correlation detection techniques. Correlation detection techniques include a plurality of methods for identifying features of interest in a set of failure data, or sets of common failures where the features of interest have a relatively high probability of appearing in these sets for tests runs that fail, but have a relatively lower probability of appearing in the sets for test runs that pass. These features of interest may be either causes or symptoms of a specific set of common failures (or a failure cluster).

According to a further embodiment of the present invention, "smart-logging" is performed during the execution of the set of verification tests in step 200 and/or during the execution of the set of simplified tests in step 240. Smart-logging includes the user computer and/or the computer farm generating a smart-log, which includes hints organized together with log messages, which may be accumulated by the computer farm during the execution of the set of verification tests and/or the set of simplified tests on the DUV. The hints organized with the log messages may include annotation of the log messages with the hints. The smart-log may be organized temporally. That is, the hints and log messages which are associated with each other in the smart log may be presented in a timeline where the timeline substantially matches the timing of the execution of the simplified tests. The smart log provides a view of the set of failure data, the sets of common failures, and the hints over the time the simplified tests are executed to provide the user a broad overview and perspective of the failures of the DUV and/or the VE.

According to another embodiment of the present invention, "go-to-cause tracing" is performed during the execution of the simplified tests in step 240. In a go-to-cause tracing step, the computer farm is configured to collect trace information for a simplified test run, so that the execution of the simplified test run may be traced backwards by the computer farm under direction of the user computer by the user. According to one embodiment, the cause of each HDL assignment (assigning a value to a variable or node of the DUV or the VE) and HDL control flow operation (control flow operations include logical "if" statements, loops etc, that determine the flow of program execution in the DUV and the VE.) may be queried via a user query, which provides that the computer farm and/or user computer may be configured to receive user commands to direct the computer farm to step backwards through the simulated execution of the set of simplified tests run on the DUV. As the go-to-cause tracing step provides answers to the user query, the debugging process (discussed below) is made more efficient for users.

According to another embodiment of the present invention, "pass/fail" differences are compared between the simplified test runs and similar passing test runs. According to a specific embodiment, differences are determined from a comparison of the text in the log files for the simplified test runs and the passing test runs. The user computer and/or the computer farm may be configured to perform the comparisons to determine the differences. The differences determined by the comparison may be stored by the computer farm for later presentation to a user via the user computer. The pass/fail differences provide the user with indications of the failure modes or root causes of failures in the DUV. The pass/fail difference may be presented to the user in a debugging session of the DUV. Debugging is discussed below in detail.

According to a further embodiment of the present invention, "checkpointing" is performed during the execution of the simplified tests. Checkpointing includes saving a state of the DUV and/or VE (i.e., checkpoint) for various tests in the simplified test run where features of interest occur in the test results for the simplified test run. Checkpointing allows a user during a debug session of the DUV to direct the user computer to control the computer farm to apply the saved state of the DUV and/or the VE to the DUV and/or the VE. Applying the saved checkpoint to the DUV and/or the VE during a debug sessions allows the computer farm to relatively quickly put the DUV and/or the VE in the state associated with the checkpoint. Thereby, the computer farm does not need to re-execute a test run and stop at the state associated with the checkpoint. Checkpoint information for a checkpoint may be provided by the computer farm to the user computer in a set of hints for use by the user in a debug session of the DUV. Hints are discussed above.

Features of interest in a test run my include log messages, trace and coverage information, etc. (Called here test features). The set of test features may be analyzed by the computer farm to determine correlation between independent features of interest (referred to as flat correlation). Correlation may also be analyzed for a specific pattern of test features (referred to as transaction correlation). For example, the computer farm may be configured to analyze the test run output for a specific pattern of log messages. According to one embodiment, the sequencing and timing of features of interest may be used to determine correlation between the features of interest.

According to one embodiment, the user computer and the computer farm may be configured to receive information (e.g., an instruction) from a user via a user interface on the user computer to direct the computer farm in the search for correlations between features of interest. For example, the user computer may be configured to receive information that a number of features of interest should be reviewed by the computer farm together to be semantically significant for correlation consideration. For example, a user instruction provided by a user to the user computer for user by the computer farm may include that a buffer size coverage datum is to be considered together with a data loss message, because the user suspects that a full buffer may lead to data loss. For example, the user may suspect that some test runs that have passing data may be associated with full buffer memories and not lose data and that some test runs may lose data due to other causes, but the user may suspect that the correlation with a specific error will be improved if the two are considered together.

According to one embodiment, for the generation of the set of hints in step 250, "input focusing" may be performed by the computer farm. Input focusing includes methods for detecting the specific inputs into the DUV that a failure may be sensitive to. A failure may be sensitive to an input because of the specific input provided, or the nature of the failure may change with a changed input. In generally, a specific input is observed to have some influence over a failure. The computer farm may be configured to determine the specific inputs that a failure is sensitive to analytically and/or by trial and error techniques (e.g., random techniques). For example, the computer farm may be configured to vary randomly generated input to the DUV. The randomly generated inputs may be varied one at a time by the computer farm, and the computer farm may be configured to collect the output from the DUV under stimulation. For example, an audio circuit may be fed a volume control value, which may be associated with a failure in some cases. By trying out various random values it may be determined that there exists a critical value above (or below) which the circuit fails. Uncovering this fact (the critical value) brings the user much closer to identifying the failure mechanism. The computer farm may user the test results from this variation of input for additional hint generation where the hints might indicate a bug.

According to another embodiment, for the generation of the set of hints in step 250, "reassessment" may be performed by the computer farm. Reassessment includes removing hints from the set of hints where the hints might be misleading. That is, the removed hints might not direct the user to the common failure mode or the common root cause of a failure. Hints might be removed from the set of hints by validating the hints, and filtering out misleading hints. Validating a hint includes rerunning a test run and forcing the DUV states and the inputs to the DUV that were uncovered as triggers for failures. If the test results from rerunning the test runs indicate a relatively high probability of the expected failure (e.g., the failures are as expected and repeat), then the hints are valid and are not removed from the set of hints. Alternatively, if the test results from rerunning the test runs pass rather than fail or exhibits a different failure from the expected failure, then the hint is removed from the set of hints.

At a step 260, debug data is generated by the computer farm. The debug data may be generated for use in an interactive debug session of a DUV by a user via interaction with the user computer and/or the computer farm. Typically, a relatively small amount of trace information is collected during the test run of the set of verification tests in step 200, and the collection of the sets of failure data in step 210. Collection of a relatively large amounts of trace data tends to slow test step 200 and data collection step 210 because the number of tests run in this test run is relatively high, compared to a simplified test run, for example. For the collection of debug data, the simplified tests discussed in step 240 above may be run and a relatively extensive set of trace information may collected according to one embodiment of the present invention. According to a further embodiment, debug hints generated in step 250 may be interlaced into the trace information collected during step 260. Interlacing the hints with the trace information may include annotating the trace information with the hints. Combining the trace information and the debug hints provides a user a data set that the user can use interactively with the user computer and the computer farm for interactive debug (described below) in a relatively efficient manner. The debug data may be saved in memory for later transfer to and presentation on the user computer.

At a step 270, the user computer is configured to present the debug data, hints, sets of common failures, and/or the set of failure, etc. on the user computer (e.g., on the computer monitor) in a VE, or the like. The user computer and/or the computer farm interacting with the user computer, may be configured to step forward and backward through the debug data (e.g., trace information annotated with hints) or the like on the computer monitor for debug analysis by the user. The debug data may be stepped forward and backward recursively so that the user might identify error causes. According to a further embodiment, waveform data from the DUV under stimulation by the VE might also be presented on the computer monitor. Waveform data may be collected from the DUV under stimulation during the test runs of step 200 or during the test runs of the simplified tests. According to one embodiment the hints and or the debug data may be presented on the computer monitor with the waveforms data. As the user is presented with debug data that is a result of statistical analysis, failure clustering, etc. from tests runs and/or simplified test runs, the user computer and computer farm are configured provide a plethora of specific data, focused on the failures so that the debug process is simplified and thereby saves the user time and effort during the highly time consuming process of debugging a DUV.

According to one embodiment of the present invention, the computer farm is configured to execute a primary fix regression at a step 280. Primary fix regression includes the computer farm generating a compact regression test set based on the sets of common failures. The compact regression test set is configured to include tests that have passing test results for verifying that a bug in the DUV and/or VE is fixed.

According to a specific embodiment, the computer farm is configured to apply regression-maximization to the simplified test run. Regression-maximization techniques enhance the simplified test runs with features of interest derived from the sets of common failures to derive a relatively compact set of tests to identify failure modes and/or a root causes of a failures with relatively high probability. The compact set of tests may be used by the computer farm to verify that a DUV and/or VE have been fixed, and may also be used by the computer farm to detect re-occurrence of failures. Regression maximization refers to the re-execution of the relevant tests on the fixed DUV/DE, while applying deliberate random perturbations that may increase the probability of detecting errors—technically aiming to increase coverage. For example, assume the failure is related to a memory pointer stepping out of bounds. After the fix, random addresses will be generated with a high probability of hitting the memory array boundary to ensure no out of bounds access occurs. After a bug is identified and fixed (e.g., step 280), regression maximization may apply to verify that the bug is indeed fixed and no other failures are uncovered after the fix. Again, this can apply to the simplified test as well as the original one.

It is to be understood that the examples and embodiments described above are for illustrative purposes only and that various modifications or changes in light thereof will be suggested to persons skilled in the art, and are to be included within the spirit and purview of this application and scope of the appended claims. Therefore, the above description should not be understood as limiting the scope of the invention as defined by the claims.

What is claimed is:

1. A computerized method of characterizing a design under verification (DUV) by a set of computers on a computer farm, the method comprising:
   executing in a verification environment (VE) a set of verification tests on a DUV to stimulate the DUV to collect test results from the DUV;
   collecting a set of failure data for the test results;
   generating sets of common failures by clustering the failure data;
   generating a set of simplified tests by removing a portion of the set of verification tests executing the set of simplified test;
   generating a set of hints from the common failures, wherein the hints indicate a potential failure mode or a potential root cause failure of the DUV for the test results for the simplified set of tests;
   generating a set of debug data from the set of simplified tests, the sets of common failures, wherein the debug data including trace information collected from the set of simplified tests; and
   transferring the set of hints and the set of debug data to a user computer for storage, display, and use in an interactive debug session of the DUV.

2. The computerized method of claim 1, wherein clustering the failure data comprises identifying failure features of interest in the set of failure data from i) log messages, ii) trace information from a trace of executing the set of verification tests or executing the set of simplified tests, or iii) coverage information derived from set of failure data or the sets of common failures.

3. The computerized method of claim 1, wherein the step of generating the set of hints includes collecting hints by static hint collection.

4. The computerized method of claim 3, wherein static hint collection includes lint checking source code of an DUV to identify a known pattern in the source code, which indicate a potential failure mode or a potential root cause of the DUV.

5. The computerized method of claim 3, wherein static hint collection include correlating the known pattern in the source code with test failure information from execution of the set of verification tests or the set of simplified tests.

6. The computerized method of claim 1, wherein the step of generating the set of hints includes collecting hints via dynamic hint collection.

7. The computerized method of claim 3, wherein dynamic hint collection includes analyzing run traces from the traces of test runs for the set of verification tests or for the set of simplified tests.

8. The computerized method of claim 1 wherein generating a set of simplified tests comprises:
   generating the set of simplified tests from the set of verification tests based on the sets of common failures by removing a portion of the set of verification tests, wherein the simplified tests includes failing tests from the set of verification tests;
   executing in the VE the set of simplified tests on the DUV to collect a test results from the DUV;
   generating another set of hints from the test results from the execution of the set of simplified tests; wherein the hints in the other set of hints indicate a potential failure mode or a potential root cause failure of the DUV for the test results for the simplified set of tests; and
   transferring the other set of hints to a user computer for storage, display, and use in an interactive debug session of the DUV.

9. The computerized method of claim 8, wherein the step of generating the set of simplified tests from the set of verification tests is iteratively performed until tests, which have passing tests, are removed from the set of verification tests.

10. The computerized method of claim 8, wherein the step of generating the set of simplified tests includes analyzing the test results for the set of verification tests to identify failing tests in a temporal window of the tests results for the set of verification tests, and removing the set of verification tests the tests that are outside of the temporal window.

11. The computerized method of claim 1, further comprising executing a primary fix regression.

12. The computerized method of claim 11, wherein the step of executing primary fix regression includes generating a compact regression test set based on the sets of common failures, wherein the compact regression test set is configured to include passing test results for verification that a bug in the DUV fixed subsequent to debugging the DUV.

13. A computerized method of characterizing a design under verification (DUV) by a set of computers on a computer farm, the method comprising:
   executing in a Verification environment (VE) a set of verification tests on a DUV to stimulate the DUV to collect test results from the DUV;
   collecting a set of failure data for the test results;
   generating sets of common failures based on clusters of failure features of interest in the set of failure data;
   generating a set of simplified tests from the set of verification tests based on the sets of common failures by removing a portion of the set of verification tests, wherein the simplified tests includes failing tests from the set of verification tests;
   executing in the VE the set of simplified tests on the DUV to collect test results from the DUV;
   generating a set of hints from the test results from the execution of the set of simplified tests; wherein the hints indicate a potential failure mode or a potential root cause failure of the DUV for the test results for the simplified set of tests;
   generating a set of debug data from trace information collected during the execution of the set of verification tests; and
   transferring the set of hints and the set of debug data to a user computer for storage, display, and use in an interactive debug session of the DUV.

14. The computerized method of claim 13, wherein the failure features of interest include i) log messages, ii) trace information from a trace of executing the set of verification tests or executing the set of simplified tests, or iii) coverage information derived from set of failure data or the sets of common failures.

15. The computerized method of claim 13, wherein the step of generating the set of hints includes collecting hints by static hint collection.

16. The computerized method of claim 15, wherein static hint collection includes lint checking source code of an DUV to identify a known pattern in the source code, which indicate a potential failure mode or a potential root cause of the DUV.

17. The computerized method of claim 15, wherein static hint collection include correlating the known pattern in the source code with test failure information from execution of the set of verification tests or the set of simplified tests.

18. The computerized method of claim 13, wherein the step of generating the set of hints includes collecting hints via dynamic hint collection.

19. The computerized method of claim 18, wherein dynamic hint collection includes analyzing run traces from the traces of test runs for the set of verification tests or for the set of simplified tests.

20. The computerized method of claim 13, wherein the step of generating the set of simplified tests from the set of verification tests is iteratively performed until tests, which have passing tests, are removed from the set of verification tests.

21. The computerized method of claim 13, wherein the step of generating the set of simplified tests includes analyzing the test results for the set of verification tests to identify failing tests in a temporal window of the tests results for the set of verification tests, and removing the set of verification tests the tests that are outside of the temporal window.

22. The computerized method of claim 13, further comprising executing a primary fix regression.

23. The computerized method of claim 22, wherein the step of executing primary fix regression includes generating a compact regression test set based on the sets of common failures, wherein the compact regression test set is configured to include passing test results for verification that a bug in the DUV fixed subsequent to debugging the DUV.

24. A non-transitory computer readable storage medium containing program instructions that, when executed by a controller within a computer, cause the controller to execute a method for characterizing a design under valuation (DUV) by a set of computers on a computer farm, the method comprising:
   executing in a verification environment (VE) a set of verification tests on a DUV to stimulate the DUV to collect test results from the DUV;
   collecting a set of failure data for the test results;
   generating sets of common failures by clustering the failure data;
   generating a set of simplified tests from the set of verification tests based on the sets of common failures by removing a portion of the set of verification tests, wherein the simplified tests includes failing tests from the set of verification tests;
   executing in the VE the set of simplified tests on the DUV to collect a test results from the DUV;

generating a set of hints from the test results from the execution of the set of simplified tests; wherein the hints indicate a potential failure mode or a potential root cause failure of the DUV for the test results for the simplified set of tests;

generating a set of debug data from trace information collected during the execution of the set of verification tests; and transferring the set of hints and the set of debug data to a user computer for storage, display, and use in an interactive debug session of the DUV.

25. The non-transitory computer readable storage medium of claim 24, wherein clustering the failure data comprises identifying failure features of interest in the set of failure data from i) log messages, ii) trace information from a trace of executing the set of verification tests or executing the set of simplified tests, or iii) coverage information derived from set of failure data or the sets of common failures.

26. The non-transitory computer readable storage medium of claim 24, wherein the step of generating the set of hints includes collecting hints by static hint collection.

27. The non-transitory computer readable storage medium of claim 26, wherein static hint collection includes lint checking source code of an DUV to identify known patterns in the source code, which indicate a potential failure mode or a potential root cause of the DUV.

28. The non-transitory computer readable storage medium of claim 26, wherein static hint collection include correlating the known pattern in the source code with test failure information from execution of the set of verification tests or the set of simplified tests.

29. The non-transitory computer readable storage medium of claim 24, wherein the step of generating the set of hints includes collecting hints via dynamic hint collection.

30. The non-transitory computer readable storage medium of claim 29, wherein dynamic hint collection includes analyzing run traces from the traces of test runs for the set of verification tests or for the set of simplified tests.

31. The non-transitory computer readable storage medium of claim 24, wherein the step of generating the set of simplified tests from the set of verification tests is iteratively performed until tests, which have passing tests, are removed from the set of verification tests.

32. The non-transitory computer readable storage medium of claim 24, wherein the step of generating the set of simplified tests includes analyzing the test results for the set of verification tests to identify failing tests in a temporal window of the tests results for the set of verification tests, and removing the set of verification tests the tests that are outside of the temporal window.

33. The non-transitory computer readable storage medium of claim 24, further comprising executing primary fix regression.

34. The non-transitory computer readable storage medium of claim 33, wherein the step of executing primary fix regression includes generating a compact regression test set based on the sets of common failures, wherein the compact regression test set is configured to include passing test results for verification that a bug in the DUV fixed subsequent to debugging the DUV.

35. A computer system for characterizing a design under valuation (DUV) comprising a set of computers on a computer farm, wherein each computer includes a processor and a memory configured to store computer code, which is configured to be executed by the processor, wherein each processor of each computer is configured to execute a portion of the method, which includes the steps of:

executing in a verification environment (VE) a set of verification tests on a DUV to stimulate the DUV to collect test results from the DUV;

collecting a set of failure data for the test results;

generating sets of common failures based on clusters of failure features of interest in the set of failure data;

generating a set of simplified tests by removing a portion of the set of verification tests, wherein the set of simplified tests executing the set of simplified test;

generating a set of hints from the set of simplified tests, wherein the hints indicate a potential failure mode or a potential root cause failure of the DUV for the test results for the set of simplified tests;

generating a set of debug data from the set of simplified tests; and transferring the set of hints and the set of debug data to a user computer for storage, display, and use in an interactive debug session of the DUV.

36. The computer system of claim 35, further comprising a user computer coupled to the computer farm via a network, wherein the user computer includes a processor and a memory configured to store the set of hints and the set of debug data transferred from the computer farm for display under control of the processor for use in an interactive debug session of the DUV.

\* \* \* \* \*